United States Patent
Baumann et al.

(10) Patent No.: US 12,418,282 B2
(45) Date of Patent: Sep. 16, 2025

(54) PULSE SIGNAL MULTIPLIER FOR PROVIDING A SECONDARY PULSE SIGNAL FROM A PRIMARY PULSE SIGNAL OF A PULSE SIGNAL GENERATOR

(71) Applicant: Knick Elektronische Messgeräte GmbH & Co. KG, Berlin (DE)

(72) Inventors: Joachim Baumann, Greven (DE); Lars Schweizer, Berlin (DE); Olaf Biese, Teltow (DE)

(73) Assignee: Knick Elektronische Messgeräte GmbH & Co. KG, Berlin (DE)

( * ) Notice: Subject to any disclaimer, the term of this patent is extended or adjusted under 35 U.S.C. 154(b) by 0 days.

(21) Appl. No.: 18/681,956

(22) PCT Filed: Aug. 18, 2022

(86) PCT No.: PCT/EP2022/073124
§ 371 (c)(1),
(2) Date: Feb. 7, 2024

(87) PCT Pub. No.: WO2023/025665
PCT Pub. Date: Mar. 2, 2023

(65) Prior Publication Data
US 2025/0119126 A1    Apr. 10, 2025

(30) Foreign Application Priority Data
Aug. 26, 2021 (DE) .................. 10 2021 209 365.5

(51) Int. Cl.
*H03K 3/36*    (2006.01)
*B61L 15/00*    (2006.01)
*H03K 5/02*    (2006.01)
*H03K 5/00*    (2006.01)

(52) U.S. Cl.
CPC ............ *H03K 3/36* (2013.01); *B61L 15/0062* (2024.01); *H03K 5/02* (2013.01); *H03K 5/00006* (2013.01)

(58) Field of Classification Search
CPC ...................................................... H03K 3/36
USPC ........................................................ 327/291
See application file for complete search history.

(56) References Cited

U.S. PATENT DOCUMENTS 4,320,307 A    3/1982    Schierjott
2019/0190470 A1*    6/2019    Bachus ................. G01R 15/18

FOREIGN PATENT DOCUMENTS

| | | |
|---|---|---|
| DE | 2937539 C2 | 9/1982 |
| DE | 3405130 A1 | 9/1985 |
| DE | 29613185 U | 11/1996 |
| DE | 102016214263 A1 | 2/2018 |
| EP | 0026838 B1 | 8/1983 |
| EP | 2159128 B1 | 7/2011 |
| WO | 2018024631 A1 | 2/2018 |

* cited by examiner

Primary Examiner — Tomi Skibinski
(74) Attorney, Agent, or Firm — Smartpat PLC

(57) ABSTRACT

A pulse signal multiplier for the provision of a secondary pulse signal without retroactive effect from a primary pulse signal of a pulse signal generator, in particular for the multiplication of speed sensor signals for use in train protection systems, includes an input circuit which taps off the primary pulse signal via a shielded branch signal line, an output circuit which receives the signal transmitted via the potential barrier, and an optical signal transmission path bridging the potential barrier between the input circuit and the output circuit.

17 Claims, 4 Drawing Sheets

PULSE SIGNAL MULTIPLIER FOR PROVIDING A SECONDARY PULSE SIGNAL FROM A PRIMARY PULSE SIGNAL OF A PULSE SIGNAL GENERATOR

CROSS-REFERENCES TO RELATED APPLICATIONS

This application claims the priority of German Patent Application, Serial No. DE 10 2021 209 365.5, filed Aug. 26, 2021, the content of which is incorporated herein by reference in its entirety as if fully set forth herein.

FIELD OF THE INVENTION

The invention relates to a pulse signal multiplier for providing a secondary pulse signal from a primary pulse signal of a pulse signal generator, in particular for multiplying speed sensor signals for use in train control systems and train protection systems.

BACKGROUND OF THE INVENTION

The background to the invention is explained below with reference to its use in train protection systems, although pulse signal multipliers according to the invention can of course be used universally in other practical fields, such as industrial applications in which there are high potential differences between different parts of the system (e.g. diesel emergency power generators).

In rail vehicles, the detection of movement and speed, distance measurement (odometry) and the localization of the rail vehicle are safety-relevant and indispensable. Monitoring the individual rotation of individual wheels, for example for drive and brake control, is also extremely important in terms of safety. Speed sensors are a frequently used type of sensor for this purpose. In the event of malfunctions, which may lead to incorrect results when determining the relevant variables, there is a risk of serious material damage and personal injury. Therefore, very high demands are placed on the reliability of such sensors and the further processing of their signals. Speed sensors are also used to monitor engine shafts, for example in the drive train of rail vehicles. Other shafts, such as those of turbines, generators, shafts within machine tools, construction machinery, road vehicles, etc. are also monitored very frequently.

Speed sensors are typically Hall effect-based, non-contact transducers whose sensor surface is mounted at a very small distance of approx. 1-3 mm from the teeth of a ferromagnetic target wheel. The pulse frequency is determined by the number of teeth and the rotational frequency of the target wheel. If the target wheel is mechanically coupled to a carriage wheel of a rail vehicle, the pulse frequency can therefore be used as a measure for the speed of the vehicle, for the individual rotation of the carriage wheel and also for determining the distance and relative position of a vehicle. As a rule, two speed sensors are installed together in one sensor housing, whose speed pulse signals are nominally shifted by 90° or 120° in phase in order to enable the direction of rotation to be recognized. These sensor channels of a speed sensor are called tracks. However, speed sensors with one track or more than two tracks are also commonly used. The pulse signals from these speed sensors are usually processed by the corresponding control devices of a train control system.

Speed sensors and target wheels are installed in the immediate vicinity of the wheels in the bogie. On electric railways, the return current of the vehicle is fed into the track via the axle shafts and the wheels by means of slip ring contacts. Brush fires and other electrical contact events often result in transient interference voltages, e.g. between the vehicle body and the bogie. These transient interference voltages can have a high amplitude and high rates of change, reach the connected control device via the sensor lines and lead to interference in the speed pulse signals or even damage the control device. Electrical contact problems sometimes also lead to unwanted high currents via the connection line of the speed sensor, which can also lead to signal problems or even damage to the sensor, the connection line and its connection points or even the control device. Contact problems with other sliding current collectors, such as between pantographs and contact wires or sliding contacts and conductor rails, can also lead to interference with the speed pulse signal, as these are located close to the return current path.

Speed sensors with voltage output for the speed pulse signal typically have the following connections and signals according to Table T1.

TABLE T1

Typical connections and parameters of speed sensors with voltage output.

| Connection | Type | Task | Type. electrical values | Remarks |
|---|---|---|---|---|
| $U_{Bsen}$ | Input | Auxiliary power supply | 10 V . . . 30 V DC | |
| $U_{outsen1}$ | Output | Voltage signal track 1 | $U_{SL} \leq 0.5$ V<br>$U_{SH} \geq (U_{Bsen} - 1$ V$)$ | Rectangular pulse signal with f = rotational frequency |
| $U_{outsen2}$ | Output | Voltage signal track 2 | $U_{SL} \leq 0.5$ V<br>$U_{SH} \geq (U_{Bsen} - 1$ V$)$ | Rectangular pulse signal with f = rotational frequency and phase offset to track 1 |
| $GND_{SEN}$ | Ground | Ground for auxiliary power and output signal (only for voltage-providing sensors) | | |

TABLE T1-continued

Typical connections and parameters of speed sensors with voltage output.

| Connection | Type | Task | Type. electrical values | Remarks |
|---|---|---|---|---|
| $Ltg_{Shldsen}$ | Shield | Shield connection of own sensor line, can be connected internally depending on the design according to a) to d) | | |

A voltage-providing speed sensor is a speed sensor that outputs its speed pulse signal as a voltage signal. The speed pulse signal from the sensor can have two level values, a low level $U_{SL}$ and a high level $U_{SH}$.

$U_{SL}$ is close to the ground potential of the sensor $GND_{SEN}$ (0 volt connection), which serves as a reference point both for its auxiliary power supply (power supply to the sensor) and for its speed pulse signal.

$U_{SH}$ of the speed pulse signal is at or slightly below the value of the operating voltage $U_{Bsen}$ of the speed sensor. The maximum amplitude of the high level of the speed pulse signal voltage $U_{SH}$ is therefore essentially proportional to $U_{Bsen}$.

Speed sensors with current output signal typically have the following connections and signals according to Table T2.

TABLE T2

Typical connections and parameters of speed sensors with current output

| Connection | Type | Task | typ. electrical values low/high level | Remarks |
|---|---|---|---|---|
| $U_{Bsen}$ | Input | Auxiliary power supply | 10 V ... 30 V DC | |
| $I_{outsen1}$ | Output | Current signal track 1 | $I_{SL}$ = 7 mA $I_{SH}$ = 14 mA or $I_{SL}$ = 7 mA $I_{SH}$ = 20 mA | Rectangular pulse signal with f = (rotational frequency * number of teeth) |
| $I_{outsen2}$ | Output | Current signal track 2 | ditto | Rectangular pulse signal with f = (rotational frequency * number of teeth) and phase offset to track 1 |
| [$GND_{SEN}$] | Ground | If available: Ground for auxiliary power and output signal | | Almost always omitted, as most current-emitting speed sensors are fed from the current loop itself |
| $Ltg_{Shldsen}$ | Shield | Shield connection of own sensor line, can be connected internally depending on the design according to a) to d) below | | |

Examples of the control devices mentioned above are understood below to be speed pulse-processing railway control devices from one of the categories TCU (Traction Control Unit), BCU (Brake Control Unit), WSP (Wheel Slide Protection), ATC (Automatic Train Control), JUR (Juridical Recorder), ETCS (European Train Control System) or other categories that may only become available in the future. Such train control devices usually perform safety functions, as they are responsible for monitoring and controlling parameters relevant to the driving safety of a rail vehicle, such as preventing unwanted wheel slippage or controlling the brakes and brake assistance devices. Due to the safety significance of such functions, multiple speed sensors for determining the wagon wheel rotation or other sensors for determining the movement of a vehicle are almost always connected to such control devices.

The sensors can also use different physical principles. In addition to the speed sensors described, radar sensors, GPS-based sensors and other sensor types are also used. For this reason, the failure of a single speed sensor (a single track or all tracks of a sensor) or a speed sensor measuring channel is usually not critical. With regard to the overall safety functionality, the failure of a measuring channel can be recognized by other sensors and their consideration by the control device and can be compensated for to a certain extent. In case of doubt, the control device must in any case automatically bring the technical unit to be checked or, if necessary, the rail vehicle into a safe state.

A control device usually has the appropriate connections for the speed sensor signals, such as supply voltage, voltage or current inputs and, if necessary, GND (ground) and shield connection. If it is designed for sensors with voltage signals, it has an auxiliary power output Vs and a GND connection. The output current of this auxiliary power output can be monitored if necessary.

In an embodiment of the control device for speed sensors with current outputs, the control device also has an auxiliary power output Vs, but not necessarily an associated GND (ground) connection. The current inputs for appropriately designed loop current-fed speed sensors also receive the supply current. At least the minimum current level (low state of the speed pulse signal) must be monitored in order to enable wire breakage detection or speed sensor fault detection.

In the course of optimizing safety in European rail transport, efforts are underway to retrofit appropriate safety systems to existing rolling stock. The problem here is that there are a large number of different train protection systems in European rail transport. This means that trains travelling internationally have to handle all the different train protection systems in the countries they travel through, which means that several different protection systems have to be installed simultaneously on the rail vehicles concerned. The ETCS system (European Train Control System) was created as part of the harmonization and standardization process. The aim is to replace existing national train protection systems with the standardized ETCS system in the long term. There are other train protection systems around the world, ETCS being mentioned as only one example. There are various strategies for retrofitting. One of these is that the existing train control system on the vehicles initially remains in place in order to maintain compatibility with the train protection system still in place in the respective country. EPCS-compatible protection systems are then additionally installed. In order for the ETCS to receive corresponding sensor signals, it would have to be connected to existing sensor signal lines in parallel or in series. However, this is prohibited by the safety philosophy, in which the autonomy of each train protection system must remain independent of another. As a way out, train manufacturers install additional speed sensors, for example, but this is complex and expensive. The cost of the additional speed sensors is compounded by the installation effort for mounting and cabling in the exterior and interior of the vehicle.

With regard to the printed state of the art, reference should be made, for example, to DE 296 13 185 U1, which merely provides a technological background and discloses a conventional isolating amplifier for measuring purposes in railway applications. Here, digitized measured values are transmitted in an analogue-digital converter via an optical fibre, galvanically isolated from the high-voltage part to the low-voltage part of the isolating amplifier. DE 10 2016 214 263 A1 shows a similar functionality. DE 29 37 539 C2 shows the shielding for radio interference suppression of switching power supplies.

SUMMARY OF THE INVENTION

Based on this problem, it is an object of the invention to provide a technical solution for the provision of secondary pulse signals from primary pulse signals of a pulse signal generator that is harmless from a safety point of view in order to supply other, in particular subsequently installed control devices and safety systems of train control systems with such pulse signals.

This object is achieved by a pulse signal multiplier for the provision without retroactive effect of a secondary pulse signal from a primary pulse signal of a pulse signal generator, in particular for the multiplication of speed sensor signals for use in train protection systems, which comprises
 an input circuit which taps off the primary pulse signal via a shielded branch signal line,
  the inputs of which, adapted to the signal type, receive the primary pulse signal without retroactive effect as an input signal for further processing in the pulse signal multiplier,
  which conditions the input signal for transmission via a galvanically isolated potential barrier, and
  which is provided with its own electrical shield to optimize common mode rejection and EMC properties,
 an output circuit which receives the signal transmitted via the potential barrier,
  which conditions the transmitted signal into an output signal that faithfully simulates a primary pulse signal,
  which outputs the output signal at a signal output corresponding to the signal type of a primary pulse signal for transmission as an apparent primary, secondary pulse signal to a connectable control device, in particular a train control device, and
  which is likewise provided with its own electrical shield to optimize common mode rejection and EMC properties, and
 an optical signal transmission path which bridges the potential barrier between the input circuit and the output circuit,
  which is hermetically sealed against operating conditions that impair the optical transmission quality,
  which bridges an electrical insulation distance between the shields of the input and output circuits, and
  the electronic signal emitter and receiver of which are arranged inside the respective shield of the input and/or output circuits or inside a respective shield which has the same electrical potential as that of the respective shield of the input and/or output circuits.

The signal multiplier according to the invention has two essential tasks, namely
 a decoupling of pulse signals without retroactive effect, in particular speed sensor signals, from a primary signal circuit and
 transmission of the decoupled signals to a secondary signal circuit.

Both functionalities must be implemented under very harsh conditions, for example in a train-related application of the subject-matter of the invention:
 A) railway SIL requirements according to EN50129
 B) railway requirements according to EN50155 (general), EN50124 (insulation), EN50121 (EMC)
 C) long maintenance-free service life of 15 to 40 years
 D) large signal bandwidth (short propagation time of the binary signals between input/output in the single-digit microsecond range)
 E) high EMC and insulation robustness due to transient common-mode voltages at the signal inputs with amplitudes of up to several kiloVolts (kV) and slew rates of several hundred kilo Volts/microsecond (kV/µs) to megavolts/microsecond (MV/µs)
 F) wide operating temperature range from at least −40° C. to +85° C.

The pulse signal multiplier according to the invention provides a way out of the dilemma described above when retrofitting pulse signal transmitters, in which the pulse signal multiplier enables the branching, distribution and conversion of existing pulse signals without retroactive effect. Such input-side pulse signals are converted into an output-side pulse signal true to the signal, i.e. with the same information content. In this sense, the pulse signal multiplier according to the invention can replicate the signals of a speed sensor, for example, and make them available to other control units without galvanic coupling of the signal connections between the secondary and primary control device. This means that an error in a secondary control device cannot affect the primary signal circuit or the sensor and primary control device.

The subject-matter of the invention uses the following basic technical concepts in order to fulfil the safety requirements, in particular in train operation:

Optical signal transmission is carried out over a sufficiently large PCB distance and through a shield, whereby very good electrical insulation and very low coupling capacitance are realized. Particular importance must be attached to the longevity of the optical signal transmission path; external soiling and external condensation as well as temperature changes must not have an unacceptable influence on the optical and electrical signal transmission during the service life of the product. The ageing of the light emitter must also be adequately considered in the circuit design and, if necessary, compensated for by special measures.

Preferred embodiments of the subject-matter of the invention are set forth hereinafter. For example, a primary pulse signal can optionally be output as an apparent primary, secondary pulse signal at the corresponding signal output by a switchover unit in a signal-type-true or signal-type-changing manner. This means that the signal multiplier can be used universally, as sensors with a current output can be connected instead of sensors with a voltage output, and a voltage or current signal for a secondary control device can be freely selected independently of the signal type of the input signal.

According to a further preferred embodiment, the pulse signal multiplier according to the invention has at least two transmission channels, for example one channel per track of a speed sensor, for the decoupling of speed pulse signals without retroactive effect from existing signal circuits and subsequent transmission from the respective input to the respective output of the multiplier and further to a secondary signal circuit. Each transmission channel has an input part and an output part. These parts are configured to be completely galvanically isolated from each other and between the channels.

Further advantageous embodiments of the pulse signal multiplier relate to the connectable primary pulse signals, which can be voltage signals with a low and a high level and/or current signals preferably with a minimum value other than zero and a high level that can preferably be varied between two level values. The inputs and outputs of the pulse signal multiplier can therefore be configured independently of each other for voltage or current signals by selecting the appropriate connection terminal and by configuring operating elements, e.g. DIP switches. When configuring for current signals, it is also possible to select whether the maximum value should be 14 mA or 20 mA using a DIP switch, for example. For speed sensors that supply voltage signals, there are special designs that supply an average voltage between the low and high value when the target wheel is at a standstill. Here, so-called mid-voltage detection can optionally be implemented in the input part of the pulse signal multiplier of the respective channel.

It is also conceivable in principle, but not described in detail here, to transmit a signal recognized as a mid-voltage directly through a further, separate state of the optical transmission path. This can, for example, be a further light intensity level that lies between the light intensity levels representing the high and low levels. The generation of mid-voltage requires a voltage output stage capable of this in the output section of the multiplier.

Further preferred embodiments relate to the shields of the input and output circuit(s) of the pulse signal multiplier. Thus, all shields of the input circuit(s) and preferably output circuit(s) can be galvanically isolated from all other circuit parts of the same channel or, if applicable, the other channels. The respective shield of the input circuit(s) can also be connected to the shield of a branch line that carries the primary pulse signals, which are routed in a shielded signal line of a primary signal circuit, to the pulse signal multiplier.

As a further alternative embodiment for multi-channel arrangements, the shields of the output circuits of the at least two channels can be connected to each other or designed as a common shield on the output side.

All inputs, outputs and connections for shields of the multiplier generally have corresponding connection means for connecting cables. The connection means can be screw terminals, push-in terminals or spring-cage terminals commonly used in measurement and control technology, wherein all of these can also be configured to be pluggable. Other plug connector types can also be considered as further possible connection means. Common multi-pole types with contacting options for the cable shield, possibly also with their own shielding, are particularly relevant for use in railway technology. Other options include SUB-D and M12 plug connectors.

Further preferred embodiments of the invention relate to measures for supplying auxiliary power to the pulse signal multiplier. For example, each output circuit can be provided with a feed-in connection for additional auxiliary power supply. This makes it possible, depending on the energy requirement of the pulse signal multiplier, for a deficit in the auxiliary energy provided by the control device to be compensated by a separate power supply device if necessary. This also ensures in this case that any control device can be supplied with apparent primary secondary pulse signals by the pulse signal multiplier according to the invention.

The use of a galvanically isolated transformer between the respective output and input circuit for supplying auxiliary power to the input circuit(s) also ensures that the multiplier is without retroactive effect in this respect.

According to a further preferred embodiment of the invention, the input circuit(s) is (are) provided with a frequency divider circuit. A frequency divider can then be activated, for example, with the factors 2, 4 or 8 by means of corresponding DIP switches. The pulse frequency at the output of the respective channel is then lower than the input frequency by this divider factor.

Finally, there is also the option of equipping the output circuits of a pulse signal multiplier design comprising at least two channels with a circuit for detecting the direction of rotation of a connected speed sensor. This is done using a so-called D flip-flop, wherein the pulse signals from both channels are fed to this circuit and the ground (GND) potentials of the two output-side electronics are also connected together. However, this means that there is no longer potential isolation between the two output channels.

Further features, details and advantages of the invention are apparent from the following description of embodiment examples with reference to the accompanying drawings.

DESCRIPTION OF THE PREFERRED EMBODIMENTS

Figure 1:
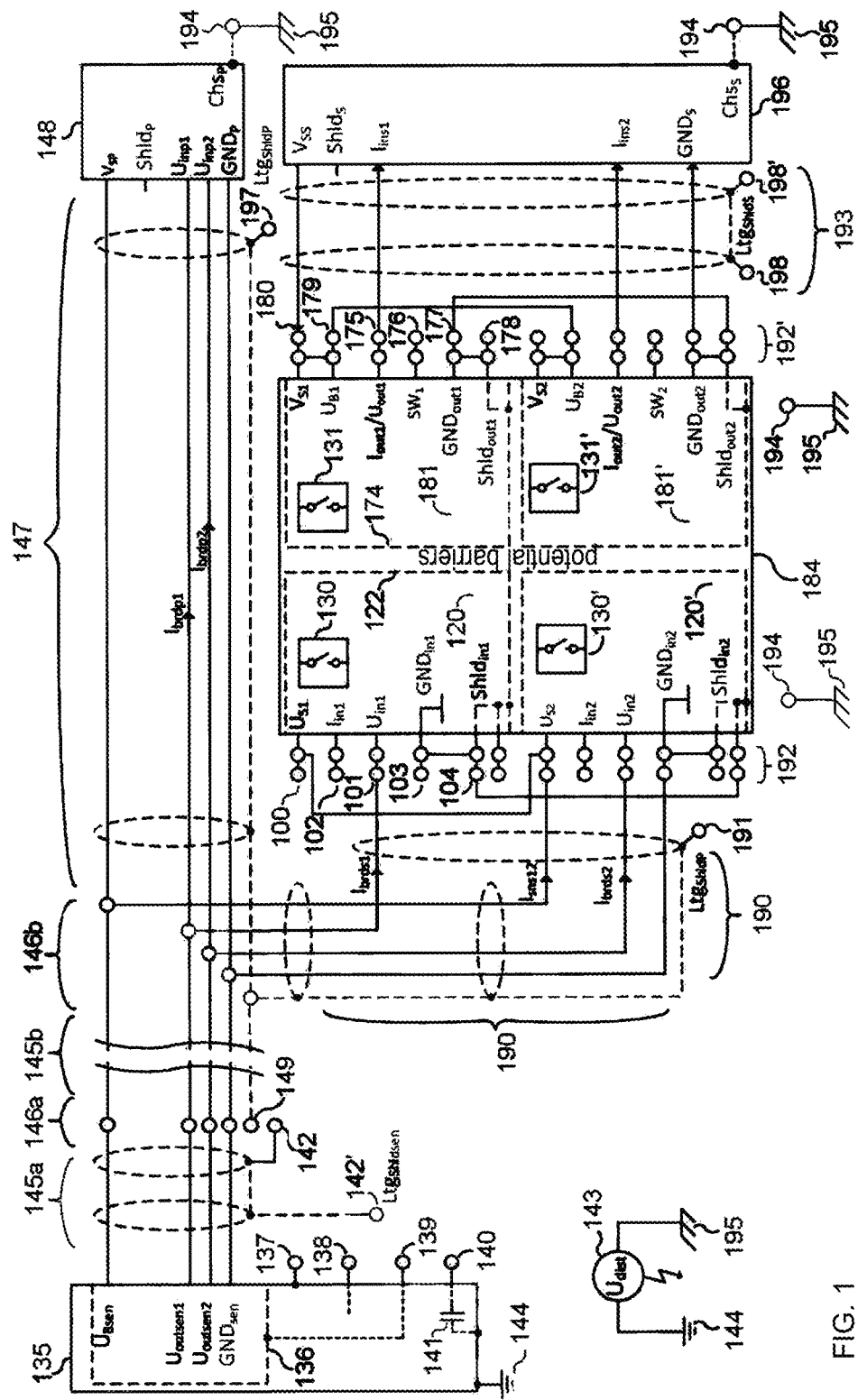
FIG. 1 shows a system block diagram of the integration of a pulse signal multiplier in a train control system with a two-channel voltage-providing speed sensor.

By way of introduction, all connections of the pulse signal multiplier (hereinafter referred to as "PSM") shown are listed in the following tables.

Table T3 shows the connections for the sensor line.

Accordingly, the PSM also contains devices that enable the connection of speed sensors with current output for the speed pulse signals. Speed sensors with current output are almost always fed from the pulse current loop itself, so the current value never falls below a minimum value, it is only switched back and forth between two current values for High and Low. The minimum value is reached for the Low signal state, for example; a typical nominal value is $I_{SL}=7$ mA. However, this value can vary somewhat depending on the sensor model and manufacturer. There are essentially two classes of current-emitting speed sensors, which are designed differently with regard to the high pulse current values. The maximum current value is achieved for the high signal state; the typical nominal values are $I_{SH}=14$ mA or

TABLE T3

Connections on the PSM for the sensor, [#]: Configuration selectable e.g. current input/voltage input, maximum current value of the high level etc. by switch at the device and wiring of the appropriate connection terminal

| Designation | Type | Task | Typ. electrical values | Remarks |
|---|---|---|---|---|
| $U_{S1}$, $U_{S2}$ | Input channel 1, channel 2 | Monitoring of $U_{Bsen}$ of the speed sensor | 10 V ... 30 V DC | Only for voltage-providing speed sensors |
| $I_{in1}$, $I_{in2}$ | Pulse signal input channel 1, channel 2 | Current signal channel 1, 2 | 7 mA/14 mA or 7 mA/20 mA [#] | Only for current-emitting speed sensors, switchable |
| $U_{in1}$, $U_{in2}$ | Pulse signal input channel 1, channel 2 | Voltage signal channel 1, 2 | ≤1 V/≥($U_{Bsen}$ − 2 V) [#] | Only for voltage-providing speed sensors |
| $GND_{in1}$, $GND_{in2}$ | Ground for input channel 1, channel 2 | Reference potential channel 1, 2 | | |
| $Shld_{in1}$, $Shld_{in2}$ | Shield of the input part channel 1, channel 2 | Internal shield channel 1, 2 | | Internally not connected to any potential other than the shield |

Table T4 shows the connections of the PSM for the secondary control device.

$I_{SH}=20$ mA, depending on the class. These values can also vary slightly depending on the sensor model and manufac-

TABLE T4

Connections on the PSM for the secondary control device, [#]: Configuration e.g. selectable via switch on the device and wiring of the appropriate connection

| Designation | Type | Task | Typ. electrical values | Remarks |
|---|---|---|---|---|
| $V_{S1}$, $V_{S2}$ | Power supply input channel 1, channel 2 | Auxiliary power supply channel 1, 2 in total, without output 1, 2 | 10-30 V DC | for separate power supply, supply of complete PSM possible |
| $U_{B1}$, $U_{B2}$ | Power supply input, channel 1, channel 2 | Auxiliary power supply only output of channel 1, 2 | 10-30 V DC | For supplying only the output driver by the control device |
| $I_{out1}/U_{out1}$ $I_{out2}/U_{out2}$ | Pulse signal output channel 1, channel 2, | Provision of output signals channel 1, 2 | 7 mA/14 mA, or 7 mA/20 mA, or ≤0.5 V/≥($U_{B1}$ − 1 V) [#] | I/U for these terminals switchable via switch |
| $SW_1$, $SW_2$ | Switching output channel 1, channel 2 | Status message channel 1, 2 | | Is switched to GND1/GND2 if not activated, otherwise open |
| $GND_{out1}$, $GND_{out2}$ | Ground for output/ power supply, channel 1, channel 2 | Reference potential channel 1, 2 | | |
| $Shld_{out1}$, $Shld_{out2}$ | Shield of the output part Channel 1, Channel 2 | Internal screen channel 1, 2 | | internally not connected to GND1/GND2 | turer. However, a slight dispersion of these values is not a problem as long as a reliable distinction can be made between the high and low signal states in the connected control devices or the PSM. In rare cases, there are also speed sensors in a special configuration with a current signal output that are not loop current-fed. Such special types then have a GND connection, as do voltage-providing speed sensors. Such speed sensors can also be connected to the PSM without any problems. Regardless of whether speed sensors have voltage outputs or current outputs, the various options a) to d) for connecting the shield of the sensor line within the sensor housing deserve special attention-see the later description in FIG. 1 for the integration of a PSM into a system with a voltage-providing speed sensor.

It should also be noted that the PSM provides neither a supply voltage nor a supply current for the operation of a speed sensor. This is still done by the primary control device. As the PSM is primarily used to decouple and distribute speed pulse signals, a sensor supply would therefore make little sense. In further developments of the PSM for special applications, the provision of supply voltage and supply current can be integrated into the PSM as an additional functionality. However, this will not be discussed further below.

The system block diagram shown in FIG. 1 is now explicitly explained in more detail below. The PSM taps off the speed pulse signals from a primary signal circuit and distributes them to a secondary control device as speed current pulse signals via the shielded line 193. The pulse signal multiplier is also supplied with auxiliary power via this line 193. Further information on the basic connection of the pulse signal multiplier to the secondary control device can be found in the description of FIG. 2.

A voltage-providing speed sensor 135 with two tracks is connected to the primary control device 148 via the sensor line 145*a*, 145*b*, as well as the connection and branching points 146*a*, 146*b* and the signal line 147. The primary control device 148 via its connection $V_{SP}$ supplies the speed sensor 135 via its connection $U_{Bsen}$ with auxiliary power. The outputs of the speed sensor $U_{outsen1}$ and $U_{outsen2}$ are connected to the inputs $U_{inp1}$ and $U_{inp2}$ of the primary control device 148 via a signal line 147. The ground connection of the speed sensor $GND_{sen}$ is connected to the ground connection $GND_P$ of the primary control device. Like all other signal lines 147, 190 and 193, the sensor line 145*a*, 145*b* is configured to be shielded. This reduces interference on the signal transmission of the line itself and also reduces the entry of line-bound interference into the electronics of the speed sensor and the control devices. Both could occur with an unshielded cable due to external electromagnetic interference and possibly galvanic coupling. Particular attention should be paid to the coupling of the shield of the sensor line 145*a* at its points 142' and 142. The speed sensor 135 is generally supplied by the sensor manufacturer with the sensor line already connected at one end. As there are different shielding concepts or shield connection concepts for the sensor connection in rail vehicles, sensor manufacturers supply speed sensors with a matching shield concept/matching shield connection. This is illustrated by the four possible "virtual" connection points 137, 138, 139 and 140, wherein a real speed sensor is only designed according to one of these variants and the respective connection of the virtual connection point 142' is hard-wired to a connection point from the group 137 . . . 140 within the speed sensor housing. The user must order the appropriate sensor variant, i.e. with the appropriate shielding and shield connection.

Here, the meaning of a virtual connection is:
a) 142' with 137: the shield of the sensor line is galvanically connected to the sensor housing.
b) 142' with 138: the shield of the sensor line in the sensor housing is open, i.e. not connected.
c) 142' with 139: there is an inner shielding envelope 136 that is galvanically isolated from the sensor housing and surrounds the sensor electronics and possibly the sensor element, and the shield of the sensor line is galvanically connected to this shielding envelope.
d) 142' with 140: the shield of the sensor line is connected to the sensor housing via a coupling capacitor 141.

There can be other types of shield connection within the sensor housing, for example the shield can also be connected to the connection $GND_{sen}$ within the sensor housing. This connection is not shown. This also applies to current-emitting sensors, provided they are a special version with a GND connection.

The speed sensor 135 is connected to the earth potential 144 via its sensor housing by means of the mechanical attachment to the bogie in the immediate vicinity of a wheel. This earth potential is determined by the potential of the track on which the carriage wheels of the bogie of the rail vehicle roll or roll off. The various sections of the signal routing between the speed sensor and the primary control device are organized as follows: The shielded sensor line starting directly at the speed sensor is 145*a*. 145*b* is a shielded signal line between the branching/connection points 146*a* and 146*b*; it can be up to 50 metres long or more. 146*a* is a branching and connection point, here e.g. a plug connection at the entry point of 145*a* into the carriage body of a rail vehicle. 146*b* is also a branching and connection point, e.g. a terminal point near the cable entry into the switch cabinet in which 148 is mounted.

Depending on the shield concept used for the sensor and the type of primary control device 148, the further connection of the shield of the sensor line 145*a* to the signal line 147 also varies. This is illustrated by the connection point 149 in FIG. 1. An example is given here: A combination frequently used by some rail vehicle manufacturers is the use of a speed sensor according to a) in combination with an interrupted shield in the branching and connection point 146*a*. This means that the two cable shields between 142 and 149 are not connected, in particular if the primary control device does not have potential isolation of the sensor signal inputs. The reason for this is to prevent stray currents between the two potentials 195 (control cabinet earth or earth of the carriage body) and 144 (track potential). Such stray earth currents can occur if the path of the return current of the rail vehicle via earth slip ring contacts into the shafts of the wheelsets is not low-resistance enough in relation to the current to be conducted. This can lead to undesirable voltage differences between the vehicle body and the bogie. Earthing contacts work with carbon or graphite sliding contacts. Such contact resistances occur, for example, when sliding contacts are worn or in the event of overcurrent. However, contact problems with the high-potential current collector (pantograph or current rail collector, current rail=also known as the "third rail") can also lead to considerable voltage differences between the carriage body and the bogie, in particular if arcing leads to steep-edged current flows. The unavoidable parasitic inductance of the cable connection between the carriage body and the earthing slip ring contact alone then causes a significant voltage drop, which can also have high frequency components. Stray earth currents can damage the speed sensor itself, the lines 145*a*, 145*b* and 147, the connection/branching point 146*a*, 146*b* as well as the connected control devices, such as the primary control device 148. A connection of the shield connection points in case a) is only possible if the primary control device 148 has an efficient potential isolation of the port for the sensor connection, i.e. all connections $V_{SP}$, $U_{inp1}$, $U_{inp2}$, $GND_P$ are isolated from other potentials inside the control device and, above all, isolated from the control cabinet earth 195. To illustrate these effects, a source of interference voltage 143 is shown in FIG. 1, which can act between the earth potential 144 and the control cabinet earth. High voltages in the kV range can occur here, as already described.

The shield connection 197 of the signal line 147 on the control device side is also not assigned to any clear connection to other points in FIG. 1. This connection of the cable shield also depends on what the manufacturer of the control device specifies. There may be a special shield connection at the control device and/or an earthing bar in the control cabinet in which the control device is mounted. Such an earthing bar is indicated by the connection point 194 near the primary control device, which is connected to the control cabinet earth.

Both the primary control device 148 and the secondary control device can generally be equipped with an electrically shielding housing. Furthermore, the control devices can be equipped with overvoltage protection elements that discharge to an earth connection of the control device.

This earth connection of the control devices exists, for example, in the form of their metal housing (chassis), which is often connected to the control cabinet earth connection 194 when mounted in the control cabinet. The earth connection of the primary control device 148 is therefore labelled $Chs_P$ (chassis primary control device) and the secondary control device is labelled $Chs_S$ (chassis secondary control device).

Control devices can also have special connections for the shield of the signal line, e.g. this is already the case with control devices equipped with multi-pole shielded connectors for the sensor inputs due to the use of shielded connectors. However, there may also be special, separately routed shield connections at control devices and these may be routed to the metal housing of the control device or its earth connection using internal isolating capacitors. The respective exact connection of the shield connection can therefore not be precisely determined in FIG. 1.

A possibly existing connection for the shields of the signal lines on the control device side is labelled $Shld_P$ for the primary control device and $Shld_S$ for the secondary control device in FIG. 1. If the speed sensor signals are now to be distributed to at least one further control device without retroactive effect, the PSM 184 is used. For this purpose, a shielded branch signal line 190 is connected in parallel to the primary signal circuit and $U_{Bsen}$ at the branching point 146b, as shown in FIG. 1. The tapping of $U_{Bsen}$ is also essential, as this ensures the correct thresholds for recognizing the high and low levels in the PSM. The PSM has a powerful potential isolation that can also withstand higher interference voltages, in particular transient overvoltages. The PSM preferably has an electrically insulating plastic housing in which the internally channel-individually and port-individually shielded electronics are housed. Individual port is understood here to mean each input with the terminals 100, 101, 102, 103, 104 and each output with the terminals 175, 176, 177, 178, 179 and 180. The numbering in FIG. 1 only takes into account channel 1 of the two-channel PSM. The port definition also applies analogously to the identically structured channel 2 of the PSM. Therefore, the two-channel PSM is ultimately a four-port device. Each port is connected to an associated electronic component.

Thus, all input terminals 100, 101, 102, 103 are connected to the electronics of the input side 120 and terminal 104 is connected to the shield 122 of the electronics of the input side 120. Accordingly, all output terminals 175, 176, 177, 179 are connected to the electronics 181 of the output side and terminal 178 is connected to the shield 174.

The same applies analogously to input part 120' and output part 181' for the identically structured channel 2 of the PSM. The switches or operating elements 130 and 131 or 130' and 131' can be used to make adjustments to the respective sensor type or control device type used in the sense of a configuration. The shields 122 and 174 are completely isolated from all other circuit parts of the PSM and are routed to the terminals 104 and 178. The design of the shields $Shld_{in1}$ and $Shld_{out1}$ (and of course the equivalents of channel 2) allows flexible adjustments to be made to the respective shielding situation of the speed sensor and the primary and secondary signal circuit. It is therefore possible to connect the shield connection 191 of the branch line to the connections $Shld_{in1}$ (104) and $Shld_{in2}$. If high overvoltages between the inner conductors of the sensor line and its shield are to be expected due to an unfavourable system design with the vehicle manufacturer, connection 104, i.e. $Shld_{in1}$ and its equivalent of channel 2, $Shld_{in2}$ can remain unconnected or be connected to $GND_{in1}$ and $GND_{in2}$.

Figure 2:
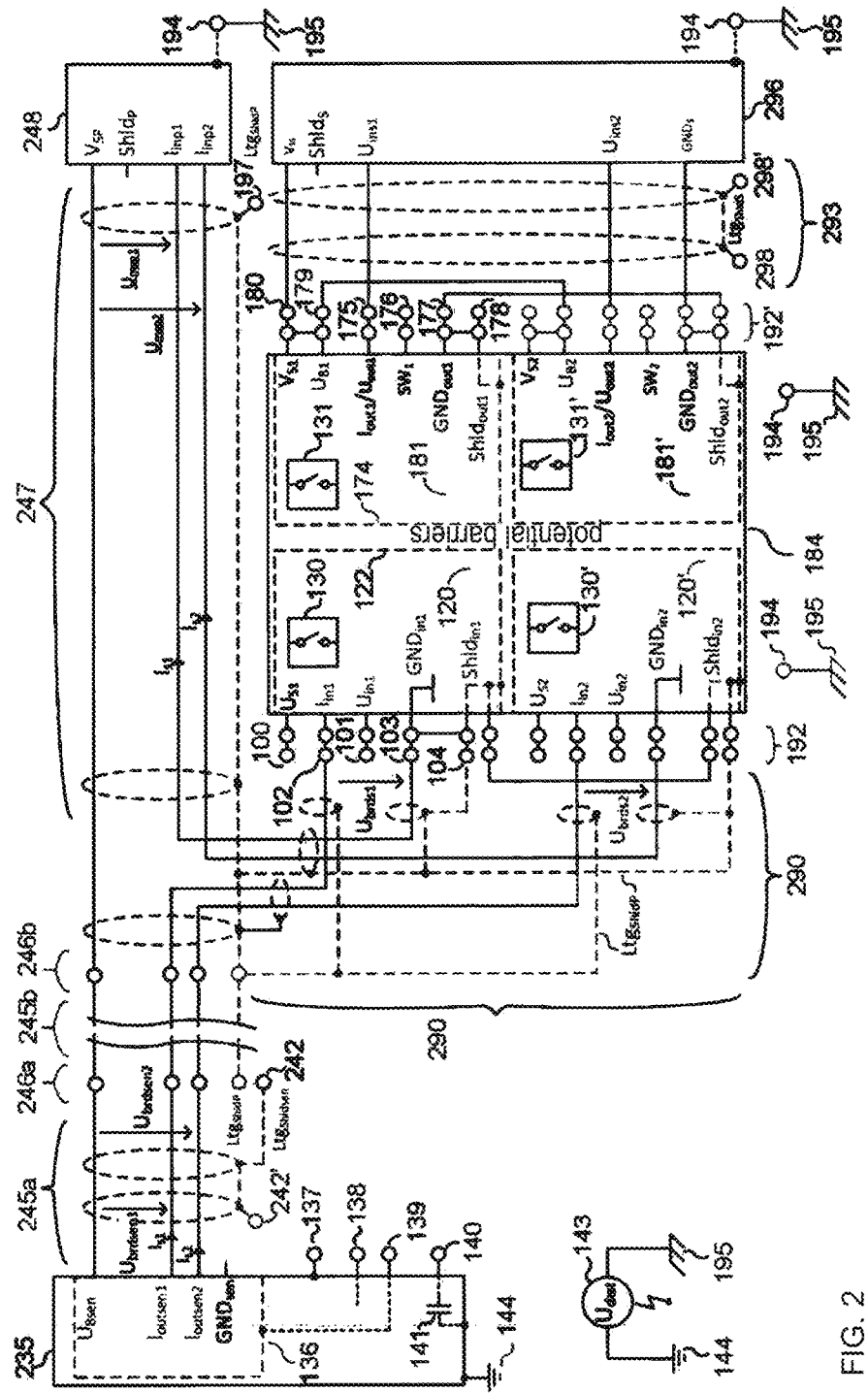
FIG. 2 shows a system block diagram of the integration of a pulse signal multiplier in a train control system with a two-channel current-emitting speed sensor.

Instead of the switches indicated here in FIGS. 1 and 2 as mechanically actuatable operating elements such as DIP switches or rotary coding switches, other options for configuring the PSM are also conceivable. These could be: solder bridges, plug-in bridges, screw bridges, coding plugs and, if necessary, the use of programmable integrated circuits, provided they do not conflict with the safety philosophy or appropriate precautions have been taken against systematic and accidental errors.

To ensure that the primary speed measurement system consisting of speed sensor and primary control device is not influenced or disturbed by the PSM, there must be no impermissible retroactive effect from the connection of the PSM. This is achieved by two parameters:

1. The minimum insulation resistance $Riso_{lnn}$ of the PSM between its input ports and all other ports is never undercut, so the potential isolation between all ports is always sufficiently good, even under high transient voltage loads, in particular common-mode voltage loads on the sensor signal circuit.
2. The input resistance $R_{in1}$ or $R_{in2}$ between $U_{in1}$ and $GND_{in1}$ or $U_{in2}$ and $GND_{in2}$ of the PSM is always high enough, which means that the current load $I_{brds1/2}$ (load current) of the sensor at each of its voltage outputs is always low enough.
3. The input resistance for the monitor inputs $U_{S1}$ and $U_{S1}$ against $GND_{in1}$ and $GND_{in2}$ must be sufficiently high The points stated under 1, and 2. also apply with regard to complex resistances and impedances. This means that with regard to the isolation of all ports from each other under 1. there should be as little parasitic coupling capacitance as possible between all ports and that sufficiently high input impedances must be implemented in terms of the input resistances under 2. In particular, input capacitances that occur in parallel with $R_{in1}/R_{in2}$ must therefore be sufficiently low.

Points 1. and 2. also apply to the entire installation with its cables, terminal points and connection points.

Easy integration into existing control systems also requires good contacting and connection options. All terminals 192 and 192' of the PSM can therefore be designed in an advantageous manner as multiple terminals, e.g. as a double terminal per connection (per pole), to enable simple installation without additional terminal blocks. This saves installation effort and costs for the user, simplifies installation and increases reliability.

Table T5 precisely specifies these conditions for the absence of retroactive effect of the PSM on the primary signal circuit.

TABLE T5

Conditions for the absence of retroactive effect of the PSM (n = channel no.)

| Output n | $I_{gesen\,n}$: Current load at the output of the speed sensor at $U_{outsen\,n} = U_{high}$ | $RisoU_{Inn}$: Insulation resistance $U_{In1/2}/Out_{1/2}/$ all other output-side ports and shlds, for all permutations [Ohm] |
|---|---|---|
| 1 | $I_{gesen1} < (I_{mxs1})$ | >500 Meg |
| 2 | $I_{gesen2} < (I_{mxs2})$ | >500 Meg |

Where $$I_{gesen1} = (I_{brdp1} + I_{brds1}),$$

$$I_{gesen2} = (I_{brdp2} + I_{brds2}),$$

i.e. the total current load at the respective output of the speed sensor.

With $I_{mxs1}$ and $I_{mxs2}$=maximum permissible current load at the respective output of the speed sensor at $U_{outsen1/2} = U_{high}$, in accordance with the manufacturer's specifications, provided that sufficient voltage level remains at the signal inputs of the primary control device. The voltage drop $U_{ltg1/2}$ on the cables must be taken into account.

$U_{ltg1/2}$=voltage drop of the entire cable path track ½ due to the ohmic resistance or due to the total cable attenuation $U_{high}$=Actual output voltage of the speed sensor at high level The conditions for the absence of retroactive effect of the PSM on the primary signal circuit (n=channel no.) for the monitor inputs $U_{S1}$ and $U_{S2}$ are specified in the following table T6.

TABLE T6

Conditions for absence of retroactive effect with regard to monitor inputs (n = channel no.)

| Output | $I_{sns12}$: Current load through monitor inputs $U_{S1}$ and $U_{S2}$ of the PSM00 | $RisoUs_n$: Insulation resistance between $U_{s1/2}/Out_{1/2}/$all other ports on the output side, all permutations [Ohm] |
|---|---|---|
| $V_{SP}$ | $I_{sns12} < (I_{mxshe} - I_{Bsen})$ | >500 Meg (channel 1)<br>>500 Meg (channel 2) |

Where:
$I_{sns12} = I_{sns1} + I_{sns2}$ (sum of the monitor input currents, as the monitor inputs $U_{S1}$ and $U_{S2}$ are connected in parallel in this application.
$I_{mxshe}$=maximum permissible current load at the auxiliary power supply output $V_{SP}$ of the primary control device in accordance with the manufacturer's specifications, provided that sufficient voltage level remains at the auxiliary power connection $U_{Bsen}$ of the speed sensor (take voltage drop on cables into account); any monitoring range for the current drawn at the auxiliary power supply output $V_{SP}$ must be taken into account.

$I_{Bsen}$ also indicates the supply current of the speed sensor.

Due to the outstanding properties of the PSM, it is also fundamentally suitable for protecting control devices of primary signal circuits. In this sense, its applicability goes far beyond the task of distribution to secondary control devices.

The system block diagram of the integration of the PSM into a train control system with a 2-channel current-emitting speed sensor 235 shown in FIG. 2 is now described below. The following applies to the signal routing for this speed sensor in FIG. 2 (equivalent to FIG. 1): The shielded sensor line starting directly at the speed sensor is 245a. 245b is a shielded signal line between the branching/connection points 246a and 246b; it can be up to 50 metres long or more.

246a is a branching and connection point, here e.g. a plug connection at the entry point of 245a into the carriage body of a rail vehicle. 246b is also a branching and connection point, e.g. a terminal point near the cable entry into the switch cabinet in which 248 is mounted. The PSM taps off the speed pulse signals from a primary signal circuit and distributes them to a secondary control device as speed voltage pulse signals. In contrast to the application shown in FIG. 1, the speed pulse signals are tapped serially here, as they are current signals.

The combined voltage/current outputs 175 and its equivalent in channel 2 of the PSM in FIG. 2 are configured as current outputs using switches 131 and 131'. The PSM is connected to the secondary control device 296 via the shielded signal line 293. The output $V_{ss}$ of the secondary control device supplies the PSM with auxiliary power, wherein the supply current of the PSM flows back via the $GND_S$ connection of the control device 296. In addition to a $V_{SS}$ connection, the secondary control device must have a $GND_S$ connection so that the auxiliary power for the PSM can be supplied. The speed pulse signals from the output side of the PSM flow via terminal 175 $I_{out1}$ into input $I_{ins1}$ of the control device and from $I_{out2}$ of the PSM into input $I_{ins2}$ of the control device.

Since the speed sensor 235 now has current outputs instead of voltage outputs, this results in slightly different conditions. The configuration shown in FIG. 2, in which the inputs of the PSM are looped into the current loops for the speed current pulse signals and are therefore in series with the current inputs of the primary control device 248, deserves particular attention with regard to the influence of electromagnetic interference. In relation to the entire current loop, $GND_{in1}$ and $GND_{in2}$ are therefore not "suspended" on a static ground potential between the speed sensor operating voltage $U_{Bsen}$. Since the PSM is then inserted into a current loop in series—i.e. the signal circuits are now connected in series with the primary control device—the current outputs $I_{outsen1}$ and $I_{outsen2}$ are connected to the inputs $I_{in1}$ (202) and $I_{in2}$ of channel 2 of the PSM. The currents flowing into these two inputs flow via the terminals $GND_{in1}$ (203) and $GND_{in2}$ back into the primary control device 248 via the branch line and the signal line 247. This means at the same time that $GND_{in1}$ and $GND_{in2}$ are no longer connected to "ground" but to the potential of the inputs $U_{inp1}$ and $U_{inp2}$ of the control device 248 to which they are connected. For this reason, connecting the shields $Shld_{in1}$ and $Shld_{in2}$ with $Gnd_{in1}$ and $Gnd_{in2}$ is not possible in most cases from an EMC perspective. Instead, the cable shield of the branch line 290 is connected to $Shld_{in1}$ and $Shld_{in2}$. Unless otherwise stated, the voltage specifications always refer to the GND potential of the respective input or output. (The following statements also apply analogously to the connection of the PSM to the secondary control device as shown in FIG. 1).

$U_{B1/2}$ is the operating voltage (auxiliary power supply) of only the respective output stage of channel no. 1 or channel no. 2 of the PSM. This auxiliary power component is normally always provided by the secondary control device. The remaining electronics of the respective output and the respective galvanically isolated input channel are fed with auxiliary power via the additional $V_{S1/2}$ terminals. A speed sensor is normally connected to the secondary control device. The PSM output that is now connected instead, including its auxiliary power requirement, should behave like a speed sensor in relation to the secondary control device. With secondary control devices that monitor the current consumption of connected speed sensors, error messages may occur if the total internal current requirement of an PSM is higher than that of the speed sensor expected by the control device. For this reason, the PSM has these two different auxiliary power terminals for each output channel. The voltage level at the terminals $U_{B1/2}$ determines the maximum possible output voltage of the outputs $I_{out1/2}$/$U_{out1/2}$ of the PSM. A speed sensor also behaves in the same way with regard to $U_{Bsen}$. If the total current consumption of the PSM does not match the monitoring range of the secondary control device, an additional auxiliary power supply device can be connected to the terminals $V_{S1/2}$. This auxiliary power supply device feeds in the remaining current required to operate the PSM and thus relieves the power supply to the control device. If the secondary control device does not monitor the auxiliary power current drawn or if the limits of the monitoring range are suitable for the total current consumption of an PSM and the current consumption of the PSM is permissible, the terminals $U_{B1}$ and $V_{S1}$ as well as $U_{B2}$ and $V_{S2}$ are connected to each other and fed by the secondary control device.

To ensure that the primary speed measurement system consisting of a current-emitting, loop-current-fed speed sensor and primary control device is not influenced or disturbed by the PSM, there must be no impermissible retroactive effect from the connection of the PSM. This is achieved by two parameters:
1. The minimum insulation resistance $Risol_{Inn}$ of the PSM between its input ports and all other ports is never fallen short of, so the potential isolation between all ports is always sufficiently good, even under high transient, in particular common-mode voltage loads on the sensor signal circuit.
2. The input resistance $R_{in1}$/$R_{in2}$ between $I_{in1}$ and $GND_{in1}$ or $I_{in2}$ and $GND_{in2}$ of the PSM is always low enough, which means that the voltage drop $U_{brds1/2}$ (load voltage) at each of its current inputs is always low enough. In addition to the voltage drop of the current inputs, there is also the voltage drop of the installation itself, i.e. the cables and terminals or connection points.

The points stated under 1. and 2. also apply with regard to complex resistances and impedances. This means that with regard to the isolation of all ports from each other under 1. there should be as little parasitic coupling capacitance as possible between all ports and that sufficiently low input impedances must be implemented in terms of the input resistances under 2. In particular, inductances that occur in series with $R_{in1}$/$R_{in2}$ must therefore be sufficiently low.

Points 1. and 2. also apply to the entire installation with its cables, terminal points and connection points.

Table T7 precisely specifies the conditions for the absence of retroactive effect of the PSM00 on the primary signal circuit.

TABLE T7

Conditions for absence of retroactive effect (n = channel no.)

| Output n | $U_{brds\ n}$: Voltage drop at input PSM at $I_{high}$ | $Risol_{Inn}$: Insulation resistance $I_{in1/2}$/$Out_{1/2}$/ all other output-side ports/all shlds, for all permutations [Ohm] |
|---|---|---|
| 1 | $U_{brds1}$ < ($U_{mxp1}$ − $U_{brdsen1}$ − $U_{ltg1}$) | >500 Meg |
| 2 | $U_{brds2}$ < ($U_{mxp2}$ − $U_{brdsen2}$ − $U_{ltg2}$) | >500 Meg |

The values are as follows:
$U_{mxp1/2}$=maximum permissible load voltage at the supplying inputs ½ of the primary control device according to the manufacturer,
$U_{brdsen1/2}$=maximum voltage drop occurring at the current-reducing outputs of the speed sensor according to the manufacturer
$U_{ltg1/2}$=voltage drop of the entire path of a sensor circuit, i.e. including the return path and connection points for channels 1 and 2 between the sensor, the PSM and the primary control device due to their ohmic resistance
$I_{high}$=actual current value at high level (nominally 14 mA or nominally 20 mA)

To ensure absence of retroactive effect even in the event of contact problems between, for example, double-level connection terminals and the PSM current inputs $I_{in1}$/$I_{in2}$, or in the event of damage to the internal circuit of the PSM, the double-level connection terminals between the connections $I_{in1}$ (102) and $GND_{in1}$ (103) and between the corresponding terminals of the second channel $I_{in2}$ and $GND_{in2}$ can have diode blocks (these are not shown) mounted with the polarity in the forward direction. Provided that the forward voltage of the diode blocks is always greater than the load voltages $U_{brds1}$ and $U_{brds2}$, the proper functioning of the current inputs $I_{in1}$ and $I_{in2}$ is not impaired as the diodes do not interfere. The diode blocks each contain at least one or more diodes connected in parallel and, due to their almost constant voltage drop, ensure that the current loop continues to function if the load voltages should increase inadmissibly in the event of a fault. Of course, the possible higher voltage drop of the diodes must then be taken into account in the voltage drop of the overall installation so that no so-called ripple occurs, i.e. the required current thresholds for the high level are no longer reached.

In the following, the more detailed structure of one of the two channels of the PSM as shown in FIGS. 1 and 2 is explained in more detail with reference to FIG. 3:

The speed pulse signal from the voltage-providing speed sensor 135 is fed to the input 101 of the PSM. The supply voltage $U_{Bsen}$ of sensor 135 applied to speed sensor 135 is also tapped off and fed to the input 100 of the PSM. The ground connection $GND_{sen}$ of the speed sensor 135 is connected to connection 103. The various options for connecting the cable shield of the speed sensor to the PSM have already been discussed elsewhere in this description.

The voltages present at the two inputs 100, 101 of the PSM are each fed to the two inputs of a comparator unit 310 via a separate voltage divider unit 305 or 306. Both voltage divider units 305 and 306 can each contain frequency bandwidth-limiting measures, such as capacitors and overvoltage protection measures. For example, two diodes can be used as overvoltage protection measures, which can lead to two different potentials, such as an internal operating voltage that is positive with respect to GND1 and to GND1 itself, and thus limit the signal arising downstream of the voltage divider to a range around these two potentials, plus the forward voltage of the diodes.

Each of the voltage dividers contained in the voltage divider units 305, 306 can advantageously be designed in such a manner that they lead its input signal via at least two series resistors to a base resistor. This series connection prevents the input resistance at the input 100 or 101 from becoming impermissibly low, for example in the event of a fault such as a short circuit of a single resistor, as a result of which the absence of retroactive effect of the PSM to the primary system would no longer be guaranteed.

The pulse voltage $U_{outsen1}$ applied to input 101 must now be evaluated as follows:

It is assumed that the output signal of the comparator unit 310 corresponds to the PSM-internal (low) value "$V_L$". If the voltage at the input 101 and therefore also at the non-inverting input of the comparator unit 310 is now increased until it exceeds the voltage at the inverting input of the comparator unit plus a hysteresis value, the output signal of the comparator unit 310 changes to the (high) value "$V_H$". If the voltage at input 101 and thus at the non-inverting input of the comparator unit 310 is now reduced again until it is lower than the voltage at the inverting input minus a hysteresis value, the output signal of the comparator unit 310 tilts back to "$V_L$". The comparator unit 310 is designed internally in such a manner that the hysteresis always remains the same in ratiometric terms (in relation to the voltage at the monitor input $U_{S1}$). In this sense, the comparator symbol in 310 only illustrates the basic function and not the complete circuit.

As a numerical example, the speed sensor is supplied with $U_{Bsen}$=12 volts. By capturing $U_{Bsen}$ at the input 100, it is ensured that the pulse voltage of the sensor in the PSM is reliably recognized as "High" if the voltage at the input 101 exceeds the value of $U_{Hi}$=0.7*$U_{Bsen}$=8.4 V. If the voltage at the input 101 falls below the value of 0.3*$U_{Bsen}$=3.6 V, it is reliably recognized as low. This works for all permissible values of $U_{Bsen}$, e.g. also for $U_{Bsen}$=24 volts. In this case, the switching thresholds at the input 101 are 16.8 V for high and 7.2 V for low.

Due to the voltage divider units 305 and 306 and the special structure of the comparator unit 310, the switching thresholds for low and high are always at the same proportions of the supply voltage of the sensor and thus a constant "ratiometric" hysteresis is achieved, which is independent of the absolute level of the actual supply voltage of the sensor.

Current-emitting sensors must be connected to the input 102 with 103 as GND. The input 102 leads to the shunt resistor unit 307, which also contains at least one overcurrent protection element in the form of two diode sections connected in anti-parallel. The flow voltage of the diodes is above the voltage that drops across the parallel connection of the shunts during normal operation, so that the signal currents flowing through the shunts can be detected correctly.

To ensure the greatest possible absence of retroactive effect, the unit 307 preferably has two shunt resistors connected in parallel. This is important if other signal sinks are connected in series in addition to the PSM. If, for example, a single shunt resistor becomes high-impedance if it fails, the second shunt resistor in parallel continues to act as a current path and prevents the current flow in the sensor signal circuit from being interrupted.

As a further measure to prevent interruption of this current flow, which is located outside the PSM, a bipolar diode block can be connected in an appropriately designed plug-in terminal with multiple poles per contact. The above description also applies to the flow voltage of this diode block. Such an external diode block can be used in particular if the PSM is equipped with pluggable terminals. This prevents the signal current flow to the other signal sinks from being interrupted even if the plug-in terminal is accidentally or deliberately removed from the PSM.

It should be noted that other, more complex electronic arrangements can also be used instead of diode sections. It must be considered whether the advantages of more complex circuits, such as lower voltage losses, are in a reasonable ratio to the disadvantages, such as possibly lower reliability and higher component costs. The speed pulse signal voltage obtained in the shunt resistor unit 307, which is proportional to the pulse current, is then fed to the comparator unit 311. The latter compares the speed pulse signal voltage with a voltage reference 308, the value of which can be switched over using a switch 309. In contrast to voltage-providing speed sensors, current-emitting sensors do not have an operating voltage of the sensor that needs to be detected.

Typical values for the detector thresholds, for example, are given in Table T8.

TABLE T8

Detection thresholds for 14 mA sensors (*) or 20 mA sensors (**)

| Input | Signal type | Terminals (+/−) | Detection thresholds (examples) |
|---|---|---|---|
| $I_{in1}$ | Current | 102 (Iin1)/ 103 (GNDin1) | $I_{LO1}$ = 9 mA $I_{HO1}$ = 11 mA (*) or $I_{LO1}$ = 9 mA $I_{HO1}$ = 15 mA (**) |
| $I_{in2}$ | Current | (Iin2)/(GNDin2) | ditto |

It is assumed that the output signal of the comparator unit 311 has the PSM-internal (low) value "$V_L$". If the current in the input 102 and thus also at the non-inverting input of the comparator unit is now increased until it exceeds the voltage at the inverting input of the comparator unit 311 plus a hysteresis value, the output signal of the comparator unit 311 tilts to the (high) value "$V_H$". If the current in the input 102 and thus at the non-inverting input of the comparator unit 311 is now reduced again until it is lower than the voltage at the inverting input minus a hysteresis value, the output signal of the comparator unit 311 tilts back to "$V_L$". The voltage at the inverting input of the comparator unit 311 is determined by the voltage reference 308, which can be switched between two values. As a result, the PSM is switchably adaptable for speed sensors with either nominally $I_{SH}$=14 mA or sensors with nominally $I_{SH}$=20 mA. The thresholds are typically at the values specified in table T3

The comparator unit 311 can be implemented here with less complexity than in the comparator unit 310 because there is only a single signal to be evaluated at the input 102. A changeover switch 312a, 312b is used to select between the signal path for voltage-providing or the signal path for current-emitting speed sensors. Changeover switch 312b is preferably implemented electronically, which is controlled by a simple mechanically operable switch 312a. If necessary, however, 312b can also be implemented directly as a manually operable mechanical changeover switch. The advantage of using electronic switches for 312b is that they enable shorter signal path lengths on the circuit board and are more reliable. This applies to all switches and configurable switching functions used in the PSM. The mechanical switches are then positioned at a different, uncritical location on the PCB and are protected against EMC influences and only generate control signals. The electronic switch 312b can also be implemented indirectly, in that the comparator units 310 and 311 have electronically deactivatable output stages. The outputs of 310 and 311 are then directly connected to each other. The output stage that is not required is then set to a high-impedance state, is thus deactivated and does not influence the output signal of the active comparator unit. Other electronic options for implementing this switching function are also possible, for example by fading out the unwanted signal.

At the output of switch 312b, the selected signal is routed to a frequency divider 313 that can be configured using switch 314. The frequency divider is not active in most applications or has a divider factor of 1. However, for special adaptations of speed sensors with a pole wheel with too many teeth to control systems that expect lower pulse frequencies, switch 314 can be used to select a suitable, preferably integer, divider factor; the output frequency of the PSM is then correspondingly lower than its input frequency.

Switch 314 can, for example, consist of a series of DIP switches or a rotary coding switch. For particularly high reliability requirements, individual switches can also be omitted completely and implemented using a component option, for example with low-impedance resistors or solder bridges. The output signal of the frequency divider 313 is fed to a controllable current source 315a, the output current of which feeds a light emitter 316, which preferably comprises at least one LED, whereby said light emitter 316 emits light 383 modulated in intensity. Preferably, low and high levels of the pulse signal to be transmitted are mapped directly into different current values, this corresponds to direct amplitude sensing of the luminous flux and thus the brightness of the emitted light. For example, the low amplitude of the pulse signal can be assigned a low current value by the light emitter, and the high level can be assigned a higher current value. This means that the light emission at high level would be greater than at low level. In another embodiment, a higher current value can be assigned to the low amplitude of the pulse signal by the light emitter, and a lower current value can be assigned to the high level. This means that the light emission at high level would be lower than at low level. In each of the two embodiments, the detection on the output side of the PSM must then have the corresponding detection thresholds in their comparator units and the corresponding logical transfer function so that the phase position between the speed pulse signals at the input and those at the output is as desired, for example to prevent an undesired phase reversal. In both embodiments, the controllable current source 315a is designed such that a minimum current always flows through the light emitter and thus a minimum optical luminous flux is always emitted. This minimum current is never undershot in the fault-free case.

In order to at least partially compensate for ageing effects, in particular of the light emitter 316, if necessary, the current source 315a can have a control input 315b for slow tracking of the current through the light emitter 316 in accordance with a reference signal. This reference signal is provided by a function block 315c, which contains a reference light emitter and a reference light receiver, the signal of which generates a control signal via an output stage. Preferably, the same type is used as the reference light emitter and reference light receiver as for the light emitter 316 and light receiver 350. On average, the same current flows through the reference light emitter by means of a corresponding current source as through 316. This solution is preferred over a more complex solution. The more complex solution could be the direct monitoring of the light emitted by the light emitter 316 by a monitor light receiver. However, this solution is not preferred due to the coupling to the optical path of the emitter 316. Another more complex solution could be the retransmission of signals from the light receiver 350 back to the input side 120, which would again be possible via a second optical path. This solution is also considered too elaborate and cost-intensive.

The light 383 from the emitter 316 is transmitted to the light receiver unit 350 via an electrically insulating light channel 382 and detected there. Phototransistors, for example, are particularly suitable as light-receiving components in this unit 350. Due to the fact that a minimum current always flows through the light emitter 316, a minimum light current can be monitored on the output side of the PSM, as described below. This makes it possible to recognize whether the optical transmission path is functioning properly.

Instead of LEDs and phototransistors, other semiconductor-based light emitters with good modulation properties and other sufficiently fast light receivers can also be used, such as a laser diode as a light emitter and a photodiode as a light receiver.

The light channel preferably consists of an optical fibre that is made of a material with, if possible, only minimal or negligible ageing, for example glass. Optical fibres made of polymers can also be used, provided the ageing resistance is suitable. It should be noted that the optical fibre or light channel must be highly electrically insulating. The light channel penetrates the electrical and magnetic shields on the input and output sides. Overall, it should be noted that the entire optical transmission path must be designed in such a manner that the expected ageing effects are minimized and taken into account in the overall design of the path. The light emitter in particular loses light emission over time. The coupling of the light emitter and light receiver to the optical fibre should be designed in such a manner that it is either generally insensitive to soiling and other environmental influences such as condensation etc. or that such influences can be controlled by other methods, e.g. by means of appropriate encapsulation. Instead of an optical fibre, the light channel can also be implemented in the form of a free beam path. The disadvantage of the free-beam method is the lower degree of transmission due to the beam divergence. The optical transmission path must be protected from extraneous light so that the light transmission is not affected.

In principle, all component combinations consisting of a modulatable emitter and suitable receiver that offer robust and electrically isolated signal transmission with sufficiently low transmission time and sufficiently high common mode immunity and common mode rejection with regard to EMC and electrical common mode effects are suitable. These can be: transformers, piezo transformers, capacitive couplers, radio, with suitable modulator/demodulator circuits if necessary. It should be noted that in terms of common mode rejection and EMC robustness, the above-mentioned alternatives are clearly inferior to the optical transmission through electrical shields described here.

The power supply for the electronics on the input side is provided by the transformer 372, on the secondary side of which the electrical energy is supplied to the rectifier and filter circuit 318. To the output of the latter, the voltage stabilization and further filtering 317 is in turn connected.

Multiple supply voltages can be made available on the input side. This is summarized by the circuit symbol 319, which symbolizes the power supply of the individual assemblies or function blocks of the input-side electronics in 120. The transformer 372 is designed in such a manner that it can fulfil the high requirements with regard to high insulation strength and the lowest possible coupling capacitance with high reliability and long life expectancy. At the same time, there is the requirement that it should be easy to manufacture at low cost and be able to be mounted on or integrated into a printed circuit board and take up as little volume or as little printed circuit board area as possible.

The PSM is powered via connections 179 and 180 and 177 as common ground potential $GND_{out1}$. The power supply within the output side is not electrically isolated from the other connections on the output side 181 as standard, as this is not necessary. In a further embodiment of the PSM, however, this can be implemented for special applications. This means increased effort, which is not necessary for the majority of applications because the secondary control device 196 or 296 takes over the supply of the PSM. If necessary, an approved separate power supply device, which then has electrical isolation, can also be used, as will be explained below. Terminals 180 and 177 can already be used to supply the entire PSM, i.e. all areas in 181 and 120. Terminal 179 does not need to be connected for this. The supply voltage or auxiliary power is fed from terminal 180 via the protection/filter network with electronic protection circuit 367 to the function block 368, a voltage stabilization and filtering system. Filtering means, such as capacitors, are not shown. The output of block 368 then also supplies block 364 with auxiliary power via the decoupling diode 369 and, as illustrated by the auxiliary power path 370, all function blocks to which this symbol 370 points. The auxiliary power path 370 can contain multiple operating voltages, just like the auxiliary power paths 366 and 319. Block 364 is then used to supply auxiliary power to all the blocks in the output region 181 that are not supplied by the auxiliary power path 370, namely all the stages that act directly on the output terminals, such as 358, 359 and 361b. If the secondary control device 196 or 296 has a suitable supply connection $V_{SS}$ and can supply enough power, the connection terminals 179 and 180 can be connected to each other and to the supply connection $V_{SS}$ for the speed sensor of the secondary control device 196 or 296.

Especially in the event that the secondary control device 196 or 296 cannot supply the required power, it is possible to have only terminal 179 supplied with auxiliary power by the control device. This reduces the power to be supplied because only the output stages 358, 359 and changeover switch 361b of the output side 181 of the PSM are supplied via 179. This solution is particularly advantageous if the secondary control device has implemented monitoring of the current supplied to $V_{SS}$. This is because the current into terminal 179 also corresponds approximately to the current drawn by a speed sensor that is normally connected to the secondary control device. The PSM should therefore behave towards the secondary control device in the same way as a conventional speed sensor. In this case, the connection terminal 180 can optionally be fed by a separate power supply device. The decoupling diode 365 prevents a possible return current from terminal 179. The advantage of a complete supply exclusively via terminal 180 is that this can also reduce the power consumption, provided that an efficient switching converter (step-down converter) is implemented in block 368, which then reduces the supply voltage in path 366 via the decoupling diode 369 and block 364 (protection and filtering network with electronic fuse). This would then be an advantage over the case of a direct through-connection of 179 and 180.

The light receiver unit 350 preferably converts the modulated light into a corresponding electrical signal voltage at its output, in which the low and high states of the signal and the minimum light are represented by three voltage amplitude ranges. It is also conceivable to map the signal at the output of 350 using a signal current instead of a signal voltage. A first comparator unit 353 compares the signal voltage supplied by the light receiver unit 350 with a reference value REF2 of the reference voltage source 352. The comparator unit 353 has a suitably dimensioned hysteresis which is suitable for reconstructing the low and high states. The reconstructed pulse signal is thus available at the output of the comparator unit 353 and can also be inverted by means of an inverter 355. The user can use the switch 356a (operating element) to select between inverted and non-inverted signals for further processing of the pulse signal, in the sense of an installation configuration.

It should be emphasized that the two channels of the PSM can also be connected together in parallel or in series with regard to their voltage or current inputs and are then only supplied with the signal of a single track of a speed sensor. If the signal inversion function is now activated for only one of the two channels of the PSM, the inverted and non-inverted pulse signal of one track of the speed sensor is simultaneously available at both outputs of the PSM. Two PSMs are then required to process both tracks of a speed sensor in this manner. Multiple PSMs can also be integrated together in a common housing. It is also possible, but not considered in detail here, for two or more outputs to be available for one channel of the PSM, wherein one of these outputs can also provide an inverted signal at the same time. In this case, it would not be necessary to use two PSMs in order to process both tracks of a speed sensor with the PSM while maintaining simultaneously inverting and non-inverting PSM outputs.

The switch 356a acts electrically on the electronic changeover switch 356b. It should be emphasized that the method shown here for selecting between inverted signal and non-inverted signal is shown only as a basic function of the PSM. A selectable switching function can also be achieved in other ways. For example, the comparator unit 353 itself may also be designed to be switchable in its phase behaviour. It could also be provided in duplicate, with inverse connection with respect to its inputs. In both cases, the inverter 355 would then be omitted. According to FIG. 3, the pulse signal from the changeover switch 356b reaches the input of the voltage output stage 358 and the current output stage 359, whose respective outputs are each connected to an input of a changeover switch 361. With the electronic changeover switch 361b, either the voltage output signal or the current output signal can reach the protection and filtering network 362 and thus the combined U/I output 175. The current output stage 359 is set up to be able to generate two current output signal levels $I_{outH}$ and $I_{outL}$ according to its input signal at the output. Using switch 360 (operating element), the user can set the maximum current value $I_{outH}$ in the sense of an installation configuration of the PSM, for example switching between $I_{outH}$=14 mA and $I_{outH}$=20 mA.

The minimum output current is not configurable in a standard version of a PSM and is $I_{outL}$=7 mA. The configuration is then no longer changed during regular operation of the PSM. The current output stage 359 can therefore supply a speed pulse signal which, depending on switch 360, can assume the two states 7 mA/14 mA or 7 mA/20 mA. For the two output voltage levels that represent low and high, i.e. $U_{outL}$ and $U_{outH}$, please refer to Table T4 above.

For the purpose of monitoring the basic function of the optical signal transmission path, the so-called dark current or the minimum luminous flux at the receiver 350 is monitored. For this purpose, the comparator unit 354 compares the output voltage of the light receiver unit 350 with the reference voltage source 351 (REF3) and, if it falls below a hysteresis value, sends a control signal to the electrically controllable electronic switch 357, which is preferably implemented by means of a MOSFET. In this case, the electronic switch opens. Provided that the signal voltage at the input of the comparator unit 354 is always above the threshold determined by 351 plus a hysteresis value, the controllable switch 357 is always closed. A voltage applied to the switching output 176 then generates a current flow against $GND_{out1}$ via the filtering and protection network 363, which current flow can switch an external relay, for example. The filtering and protection network 363 protects the electrically controllable switch 357 against electrical overload and malfunctions, including EMC influences.

Figure 3:
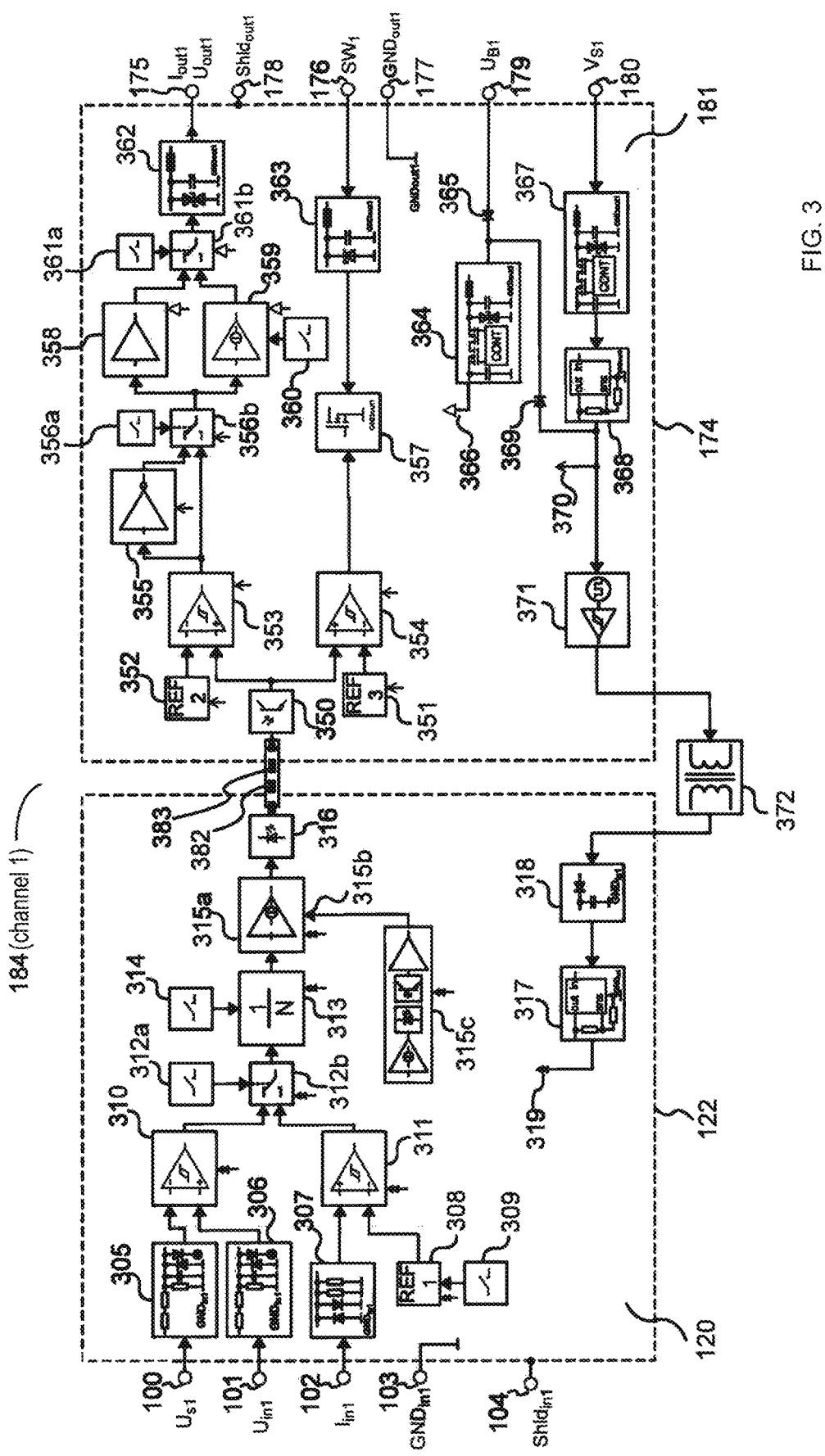
FIGS. 3 and 4 show block diagrams of a single channel of a generally two-channel pulse signal multiplier in two different embodiments.
Figure 4:
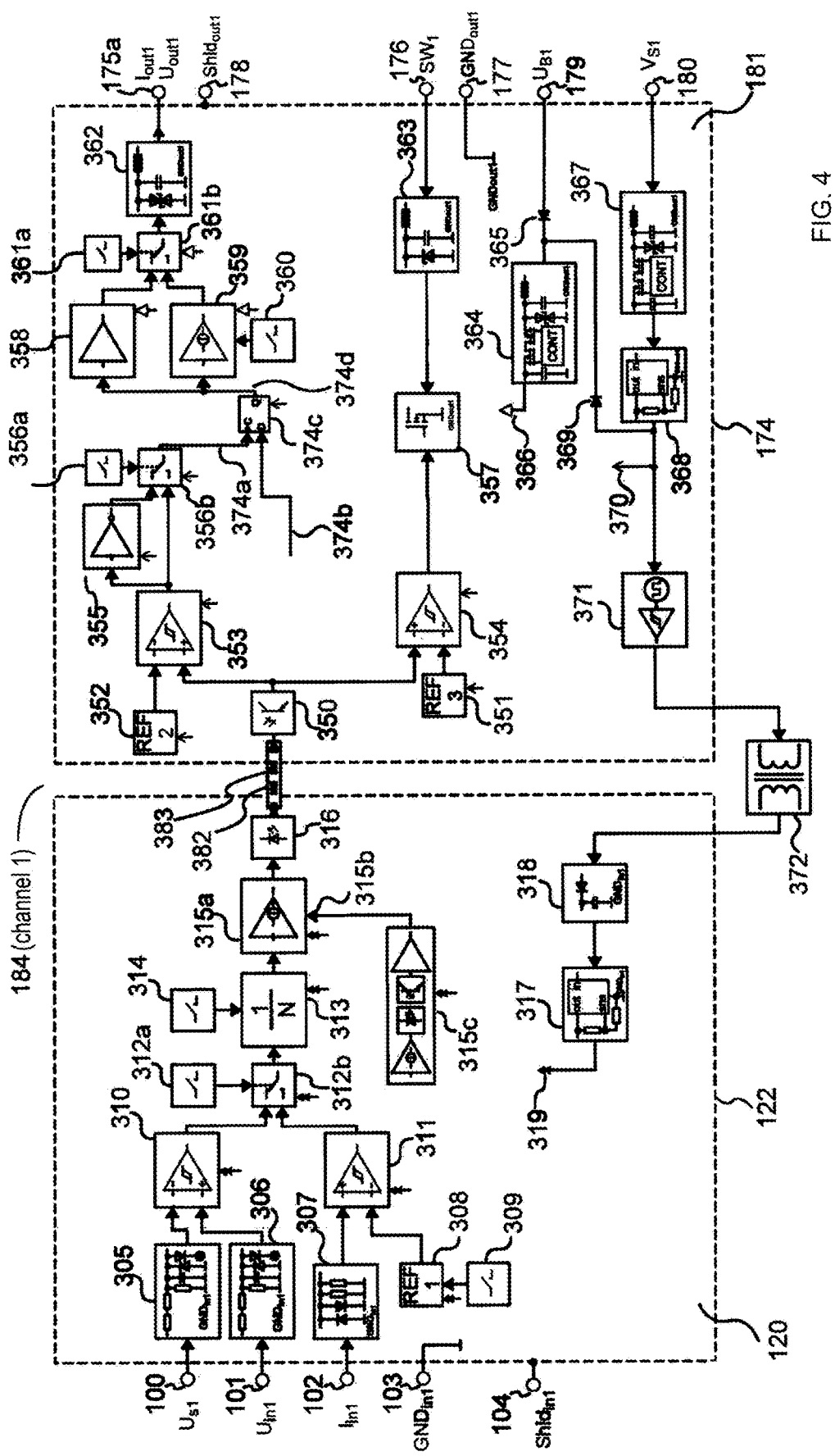

FIG. 4 now shows a block diagram analogous to FIG. 3, however extended by the aforementioned optional device for detecting the direction of rotation or direction of travel (DOT). Therefore, only the modification of the embodiment according to the invention of FIG. 4 compared to that of FIG. 3 is described below. The pulse signal is sent from the changeover switch 356b to the clock input line 374a of the D flip-flop 374c. The clock input of the D flip-flop is labelled with the letter C. The data input line 374b of the D flip-flop 374c is connected to the equivalent point in channel 2 (the equivalent point is the output of the changeover switch of channel 2 there, wherein the changeover switch there corresponds to the changeover switch 356b of channel 1). The data input of the D flip-flop is labelled with the letter D. The output signal of the D flip-flop 374c is fed back to the voltage output stage 358 and the current output stage 359 via its output line 374d. The output of the D flip-flop is labelled with the letter Q. The D flip-flop 374c works as a phase comparator as follows: The signal value (low/high) at the data input (via line 374b) is only accepted at output 374d if a rising edge is present at the clock input (line 374a). This results in an evaluation of the temporal position of the rising edge on line 374a in relation to the signal or signal change on the data line 374b. The output line then contains the information as to which signal change occurred first. This makes it possible to recognize the direction of rotation or direction of travel. A truth table or a state diagram of a conventional D flip-flop is not shown here, as this is generally known.

Circuits or logic gate types other than a D flip-flop can also be used, the only important thing is that a one-to-one, edge-controlled evaluation of the data signal takes place and that the output signal can only be influenced during one edge (either only rising or only falling edges) on only one of the two inputs of the logic circuit or logic function.

The DOT signal is now available at output 175a. This means that only the signal path between the changeover switch 356b and the voltage/current output stages has been extended by the D flip-flop 374c. This can be implemented, for example, as an assembly variant of the printed circuit board of the PSM, in which either the D flip-flop or a corresponding bridge is assembled, thereby achieving the configuration of a system either according to the block diagram shown in FIG. 3 or according to the block diagram shown in FIG. 4. It should be emphasized once again that in the case of DOT functionality (i.e. FIG. 4), the GND potentials of the output sections $GND_{out1}$ and $GND_{out2}$ must then also be connected to each other, e.g. by optionally assembling a bridge between these potentials. When implementing the DOT function according to FIG. 4, there is therefore no potential isolation between the two output sections of channels 1 and 2. However, potential isolation can be maintained if line 374b is not galvanically connected to channel 2, but receives its signal from another potential-isolating signal transmission path from channel 2. In this case, there is no need to connect the ground potential $GND_{out1}$ to $GND_{out2}$. However, this case is not explicitly shown in FIG. 4.

Finally, the essential properties of a PSM according to the invention in connection with the multiplication of speed sensor signals will be summarized:

Branching of signals from a primary signal circuit to a secondary signal circuit
Correct transmission
Sufficiently high frequency bandwidth and sufficiently small T90 time
Compliance with the correct detection thresholds for low/high detection of the sensor signals
Very good immunity to external electromagnetic interference and excellent common mode rejection
Absence of retroactive effect
No impermissible (impedance) load within the primary signal circuit
Sufficiently high input impedance for speed sensor with voltage output
Sufficiently low input impedance for speed sensor with current output
Sufficiently high impedance between primary signal circuit and secondary signal circuit and other circuits as well as earth/ground.
No emission of self-generated interference from the PSM that could interfere with the primary signal circuit or other devices
Adaptability to various speed sensors and control devices/control systems
Flexible power supply of the PSM
Switchability of the PSM inputs between current/voltage
Switchability of the PSM outputs between current/voltage
Internal, configurable frequency divider
DOT function optional
Adaptability to different shielding concepts of the signalling system
Security
Certified (railway) SIL properties for operation without retroactive effect
Certified (railway) SIL properties for correct transmission
High availability due to low error rates
Robustness
Designed for a very wide operating temperature range −40° C. . . . +85° C.
Low self-heating
High vibration resistance
Protection against overvoltages
Long service life of 15-40 years

The invention claimed is:

1. A pulse signal multiplier for generating a secondary pulse signal from a primary pulse signal of a pulse signal generator, comprising:
   an input circuit (120, 120') which taps off the primary pulse signal via a shielded branch signal line (190),
      wherein the input circuit (120, 120') comprises inputs (101, 102) that receive the primary pulse signal as an input signal for further processing in the pulse signal multiplier,
      wherein the inputs (101, 102) are adapted to a signal type of the primary pulse signal,
      wherein the input circuit (120, 120') does not change the primary pulse signal,
      wherein the input circuit (120, 120') conditions the input signal for transmission via a galvanically isolated potential barrier, and
      wherein the input circuit (120, 120') is provided with a dedicated electrical shield (122) to optimize common mode rejection and EMC properties;
   an output circuit (181, 181') which receives a transmitted signal that has been transmitted via the galvanically isolated potential barrier,
      wherein the output circuit (181, 181') conditions the transmitted signal into an output signal that simulates the primary pulse signal,
      wherein the output circuit (181, 181') outputs the output signal at a signal output (175, 175') corresponding to the signal type of the primary pulse signal for transmission as an apparent-primary, secondary pulse signal to a connectable control device, and
      wherein the output circuit (181, 181') is provided with a further dedicated electrical shield (174) to optimize common mode rejection and EMC properties; and
   an optical signal transmission path (382) bridging the galvanically isolated potential barrier between the input circuit (120, 120') and the output circuit (181, 181'),
      wherein the optical signal transmission path (382) is hermetically sealed against operating conditions that impair optical transmission quality,
      wherein the optical signal transmission path (382) bridges an electrical insulation distance between the dedicated electrical shield (122) of the input circuit (120, 120') and the further dedicated electrical shield (174) of the output circuit (181, 181'), and
      wherein the optical signal transmission path (382) comprises
         an electronic signal emitter (316) arranged inside the dedicated electrical shield (122) or inside a shield having the same potential as the dedicated electrical shield (122), and
         an electronic signal receiver (350) arranged inside the further dedicated electrical shield (174) or inside a shield having the same electrical potential as further dedicated electrical shield (174).

2. A train protection system comprising the pulse signal multiplier according to claim 1 for the multiplication of speed sensor signals.

3. The pulse signal multiplier according to claim 1, wherein the connectable control device is a train control device.

4. The pulse signal multiplier according to claim 1, wherein the primary pulse signal can optionally be output by a switching unit (130, 130') as a signal-type-true or signal-type-changing apparent primary, secondary pulse signal at the signal output (175, 175').

5. The pulse signal multiplier according to claim 1, comprising an at least 2-channel structure, wherein each channel has a shielded input circuit (120, 120'), shielded output circuit (181, 0181') and signal transmission path (383), and all input (120, 120') and output circuits (181, 181') are galvanically isolated internally and across channels.

6. The pulse signal multiplier at least according to claim 5, wherein the shields (174) of the output circuits (181, 181') of the at least two channels are one of connected to one another and are formed as a common output-side shield.

7. The pulse signal multiplier according to claim 1, wherein voltage signals with a low level and a high level can be transmitted as primary pulse signals.

8. The pulse signal multiplier according to claim 1, wherein current signals with a low level and a high level can be transmitted as primary pulse signals.

9. The pulse signal multiplier according to claim 8, wherein current signals with a minimum value other than zero can be transmitted as primary pulse signals.

10. The pulse signal multiplier according to claim 8, wherein current signals variable between two level values, can be transmitted as primary pulse signals.

11. The pulse signal multiplier according to claim 1, wherein the dedicated electrical shield (122) of the input circuit (120, 120') is galvanically isolated from all other circuit parts of a same channel or, if applicable, of further channels.

12. The pulse signal multiplier according to claim 11, wherein the output circuit (181, 181') is galvanically isolated from all other circuit parts of the same channel or, if applicable, of the further channels.

13. The pulse signal multiplier according to claim 1, wherein the dedicated electrical shield (122) of the input circuit (120, 120') is connected to a shielding (191) of the shielded branch signal line (190) which leads the primary pulse signals carried in a shielded signal line (147) of a primary signal circuit to the pulse signal multiplier.

14. The pulse signal multiplier according to claim 1, wherein the output circuit(s) (181, 181') is (are) provided with a feed-in connection (180) for auxiliary power supply.

15. The pulse signal multiplier according to claim 14, wherein a galvanically isolated transformer (372) is provided between the respective output circuit (181, 181') and input circuit (120, 120') for supplying auxiliary power to the input circuit(s) (120, 120').

16. The pulse signal multiplier according to claim 1, wherein the input circuit(s) (120, 120') is (are) provided with a frequency divider circuit.

17. The pulse signal multiplier according to claim 1, wherein the output circuit(s) (181, 181') is (are) provided with a circuit for detecting a direction of rotation of a connected speed sensor.

* * * * *